(12) United States Patent
Wu

(10) Patent No.: US 12,718,877 B1
(45) Date of Patent: Aug. 25, 2026

(54) BITCELL POWER TRACKING SCHEME FOR TRANSIENT VOLTAGE COLLAPSE WRITE ASSIST

(71) Applicant: Synopsys, Inc., Sunnyvale, CA (US)

(72) Inventor: Che-Wei Wu, Hsinchu County (TW)

(73) Assignee: Synopsys, Inc., Sunnyvale, CA (US)

( * ) Notice: Subject to any disclaimer, the term of this patent is extended or adjusted under 35 U.S.C. 154(b) by 57 days.

(21) Appl. No.: 18/919,644

(22) Filed: Oct. 18, 2024

(51) Int. Cl.
*G11C 11/419* (2006.01)
*G11C 11/412* (2006.01)
*G11C 5/14* (2006.01)

(52) U.S. Cl.
CPC .......... *G11C 11/419* (2013.01); *G11C 11/412* (2013.01); *G11C 5/144* (2013.01)

(58) Field of Classification Search
CPC ...................................................... G11C 5/144
See application file for complete search history.

(56) References Cited

U.S. PATENT DOCUMENTS

| | | | | |
|---|---|---|---|---|
| 9,542,998 | B1 | 1/2017 | Akhilesh et al. | |
| 2017/0243635 | A1 | 8/2017 | Sonkar | |
| 2021/0125662 | A1* | 4/2021 | Kuo | G11C 5/144 |

* cited by examiner

*Primary Examiner* — Jason Lappas
(74) *Attorney, Agent, or Firm* — Davenport IP Law, PLLC

(57) ABSTRACT

An example is a method. A pseudo array supply voltage (VDDAI) of a bitcell power tracking column for a memory array is determined by a write assist circuit coupled to the memory array. An actual VDDAI provided to a bitcell in the memory array during a write operation, based on the pseudo VDDAI of the bitcell power tracking column, is tracked by the write assist circuit. A collapse level of the actual VDDAI to the bitcell is controlled during the write operation, based on the tracking.

20 Claims, 13 Drawing Sheets

600

601
602
603
GATE DELAY
VDDAI TRACKING
COLLAPSE TARGET
VDDAI COLLAPSE LEVEL (%)
40%
35%
30%
25%
20%
15%
VDD (V)
0.5
0.55
0.6
0.65
0.7
0.75
0.8
0.85
0.9
0.95
1
1.05

BITCELL POWER TRACKING SCHEME FOR TRANSIENT VOLTAGE COLLAPSE WRITE ASSIST

BACKGROUND

Static random-access memory (SRAM) is often included in very large-scale integration (VLSI) system-on-chip (SoC) applications. There has been a trend towards reducing operation supply voltage of these integrated circuits. The reliability of SRAM circuits, however, decreases as supply voltages are reduced due to variations in circuit characteristics, such as threshold voltages of transistors.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1A:
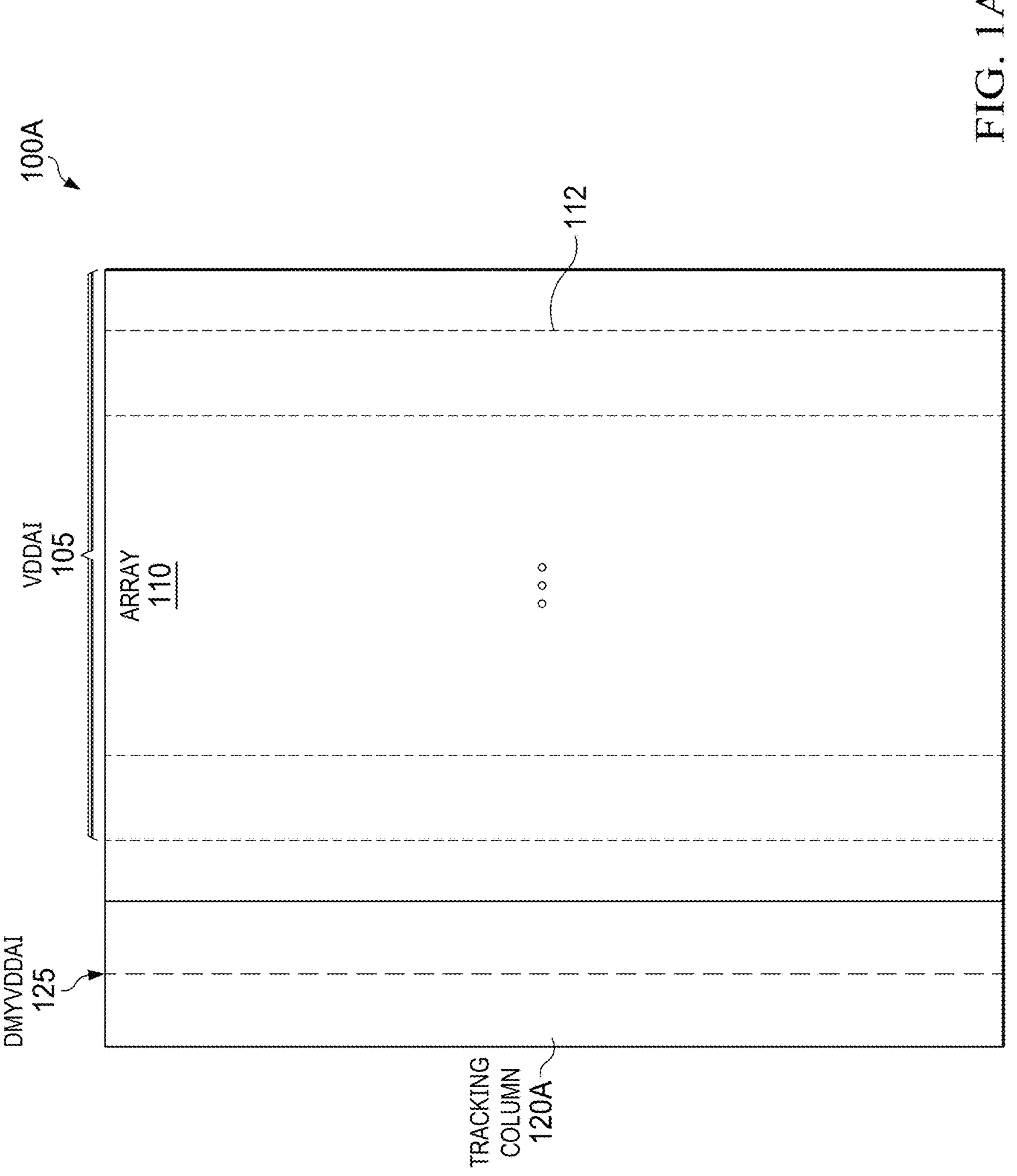
FIG. 1A is a block diagram illustrating an example of a memory circuit with a tracking column for tracking an internal array supply voltage (VDDAI) to bitcells of a memory array, according to some embodiments.

Aspects of the present disclosure relate to a bitcell power tracking scheme for transient voltage collapse write assist. A memory circuit, such as a static random-access memory (SRAM) circuit, includes an array (with rows and columns) of individual memory cells. Each memory cell (or "bitcell") in an SRAM array, for example, can store a voltage value that represents a corresponding binary logical data bit value, e.g., a logic "0" (low) value or a logic "1" (high) value. The rows and columns of bitcells in the array correspond to different word lines and bit lines, respectively. Accordingly, each row of bitcells is connected to a corresponding word line, and each column of bitcells is connected to a pair of corresponding bit lines. Each column of bitcells is also connected to a corresponding voltage supply line that is used to provide an internal array supply voltage (VDDAI) to each bitcell in the column. The VDDAI may be dynamically regulated to ensure that bitcells in the memory array receive a stable supply voltage necessary for storing and maintaining data.

To enable access to a bitcell in a row of the memory array during read or write operations, a voltage on a corresponding word line may be pulled up to a positive array supply voltage (VDDA). The VDDA may serve as a power source for generating the VDDAI to the bitcell in the array. Write assist schemes are used to improve the reliability of writes to an SRAM array in low power applications. An example of such a scheme is transient voltage collapse (TVC) write assist. This scheme temporarily reduces or collapses the VDDAI provided to a SRAM bitcell during a write operation, thereby reducing the stability of the bitcell and making it easier to flip the state of the bitcell. SRAM bitcells, however, are subject to variations (e.g., variations in transistor threshold voltages and other critical bitcell parameters) due to differences in manufacturing processes and environmental factors. As a result, employing the TVC scheme for write operations in SRAM circuit designs can still lead to an increase in the dynamic power consumption of the circuit and a decrease in the reliability of the write operations at relatively higher voltage levels. Proper control of the VDDAI collapse level is therefore essential for maintaining reliability and overall power efficiency during the write assist, especially in advanced low-voltage SRAM designs.

In some embodiments, a bitcell power tracking scheme may be employed in conjunction with the TVC write assist to control the timing and extent of the VDDAI collapse to be in synchronization with the write operation. For example, a memory circuit system may include a bitcell power tracking column that can be used to track a level of the VDDAI provided to the bitcell during the write operation. In some implementations, the tracking column is part of the memory array itself, for example, as an integrated bitcell tracking column that is manufactured alongside other columns of bitcells within the memory array. Alternatively, the tracking column may be implemented as a separate component of the memory circuit system that is coupled to the memory array. The VDDAI to the bitcell in this example may be tracked based on a pseudo (or "dummy") array supply voltage (or pseudo VDDAI) of the bitcell power tracking column. In some embodiments, the pseudo VDDAI may be measured or determined based on a resistive capacitance (RC) load of the bitcell power tracking column in the memory array during the write operation. The RC load of the bitcell power tracking column may be indicative of a discharge rate of the actual VDDAI during the write operation.

As will be described in further detail below, the pseudo VDDAI of the bitcell power tracking column may be used by a write assist circuit of the memory circuit system to generate a write assist pulse to assist the write operation by temporarily reducing or collapsing the VDDAI to the bitcell. The write assist pulse may be provided to a transient voltage collapse circuit of the system, which supplies the actual VDDAI to the bitcell. The timing or duration of the write assist pulse provided to the transient voltage collapse circuit may be used to control the collapse level of the actual VDDAI to the bitcell during the write operation. For example, the pseudo VDDAI of the tracking column may indicate to a timing generator of the write assist circuit that the VDDAI collapse level has reached a target collapse level, which triggers the timing generator to stop the write assist pulse and thereby terminate the VDDAI collapse during the write operation. This allows the timing generator to minimize the extent of the VDDAI collapse beyond the target collapse level and reduce any unwanted VDDAI collapse levels, particularly at higher voltages.

In some implementations, the bitcell power tracking column may be a column of pseudo (or "dummy") bitcells corresponding to actual bitcells in the memory array. The bitcell power tracking column may include a pseudo bitcell for each word line and corresponding row of actual bitcells in the memory array. Thus, in a 256-word SRAM array, for example, the bitcell power tracking column in the SRAM array may include 256 pseudo/dummy bitcells. While the term "actual" is used to distinguish the usual or standard bitcells in the memory array from the pseudo/dummy bitcells in the tracking column, the dummy bitcells may be identical to the bitcells in the memory array. For example, the dummy bitcells may be SRAM bitcells that were manufactured together with the bitcells in the SRAM array, e.g., by the same foundry as the SRAM array using the same manufacturing process under the same environmental conditions. The dummy bitcells in the tracking column may therefore share the same circuit design and operating characteristics as the bitcells in the SRAM array. This allows the disclosed VDDAI tracking scheme to employ the TVC write assist based on the pseudo VDDAI of the bitcell power tracking column, which accounts for the same process variations that can affect the VDDAI collapse level as well as the power consumption and reliability of the actual bitcells in the SRAM array during the write operation.

In other implementations, the bitcell power tracking column may include a series of logic devices corresponding to each row of bitcells and word lines in the memory array, where a logic device may be included for each word line and corresponding row of the actual bitcells in the memory array. Each logic device in the bitcell power tracking column may be implemented using, for example, metal oxide semiconductor field effect transistors (MOSFETs), such as a pair of p-channel MOSFETs. However, it should be appreciated that embodiments are not limited to p-channel MOSFETs and that any of various types of transistors (e.g., n-channel MOSFETs, FinFETs, bipolar junction transistors (BJTs), etc.) in any of various configurations may be used as desired for a particular implementation.

Technical advantages of the present disclosure include, but are not limited to, enabling a bitcell power tracking scheme for improved TVC write assist in a memory circuit with better power consumption and enhanced reliability across a range of power supply voltages. Unlike other TVC write assist schemes, which may use logic inverter delays to control the timing of the transient voltage collapse during a write operation to a bitcell, the disclosed power tracking scheme uses a dedicated bitcell power tracking column in the memory array to precisely track and control a collapse level of the VDDAI to the bitcell during the write operation. The VDDAI tracking scheme of the present disclosure can utilize the bitcell power tracking column to track all loading and variation of bitcell power over time. This enables more precise RC load tracking for better control of the timing and extent of the VDDAI collapse level across a range of voltages supplied to the bitcell. For example, other write assist schemes tend to consume more power as they require higher VDDAI collapse levels at higher supply voltages. Such schemes are also unable to account for the manufacturing process variations of the bitcells in a memory array, which affect dynamic power consumption during the write operation. By contrast, the disclosed VDDAI tracking scheme may utilize a bitcell power tracking column that includes bitcells that were manufactured by the same foundry as other bitcells in the memory array. Therefore, the bitcells in the tracking column may have the same characteristics and may be subject to the same manufacturing process variations as those in the rest of the memory array. Accordingly, the use of such a bitcell power tracking column in the disclosed VDDAI tracking scheme enables better control of the VDDAI collapse level so that collapse level targets may be attained at relatively lower supply voltages without increasing dynamic power consumption or reducing reliability at higher voltages.

Other features and advantages of the disclosed embodiments will be or will become apparent to one of ordinary skill in the art upon examination of the figures and following detailed description. It is intended that all such additional features and advantages are included within the scope of the disclosed embodiments. While various embodiments of the present disclosure will be described below with reference to the examples illustrated in FIGS. 1A-9, it should be appreciated that embodiments are not intended to be limited thereto. Other embodiments are possible, and modifications may be made to the illustrated examples as desired for a particular implementation.

Figure 3A:
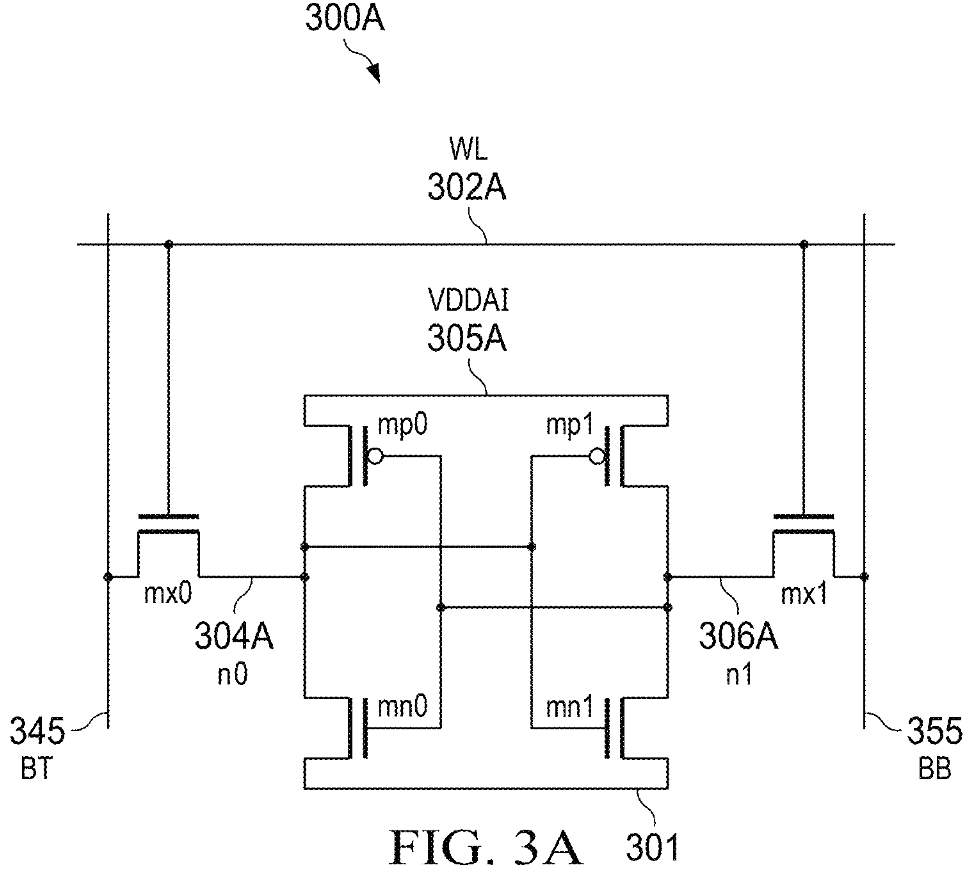
FIG. 3A is a diagram illustrating an example of a bitcell in the memory circuit system of FIG. 2, according to some embodiments.

FIG. 1A is a simplified block diagram illustrating an example of a memory circuit 100A according to some embodiments. The memory circuit 100A includes a memory array 110. Although not shown in FIG. 1A, the memory array 110 includes a plurality of memory cells (or bitcells) arranged in rows and columns corresponding to different word lines and bit lines, respectively. Each row of bitcells in the memory array 110 is coupled to a corresponding word line, and each column of bitcells is coupled to a pair of corresponding bit lines (e.g., as shown in FIG. 3A, described further below). Accordingly, data can be read from or written to each bitcell by enabling the desired word and bit lines that correspond to an address of that bitcell. Additionally, each column of bitcells may be coupled to voltage supply lines, such as a voltage supply line 112. The voltage supply lines may be used to provide an internal array supply voltage (VDDAI) 105 to the bitcells of the memory array 110.

In some embodiments, the memory circuit 100A further includes a bitcell power tracking column 120A for tracking the VDDAI to a bitcell in the memory array 110 during a write operation to the bitcell. The tracking column 120A may be used to track a level of the VDDAI 105 provided to the bitcell as part of a TVC write assist scheme to assist the write operation. For example, the memory circuit 100A may include a write assist circuit (not shown) that measures a dummy VDDAI (DMYVDDAI) 125 of the tracking column 120A, which corresponds to a level of the VDDAI 105 to the bitcell during the write operation. The memory circuit 100A may utilize the DMYVDDAI 125 of the tracking column 120A to track the VDDAI 105 and, based on the tracking, generate a write assist pulse that can be used to control a timing and extent of the VDDAI collapse level during the write operation. Although not shown in FIG. 1A, the memory circuit 100A or components thereof (including the memory array 110 and the tracking column 120A) may include any number of additional circuits or devices to provide the VDDAI tracking functionality for the TVC write assist, as desired for a particular implementation. As will be described in further detail below, different circuits or devices may be used to implement the tracking column 120A.

Figure 1B:
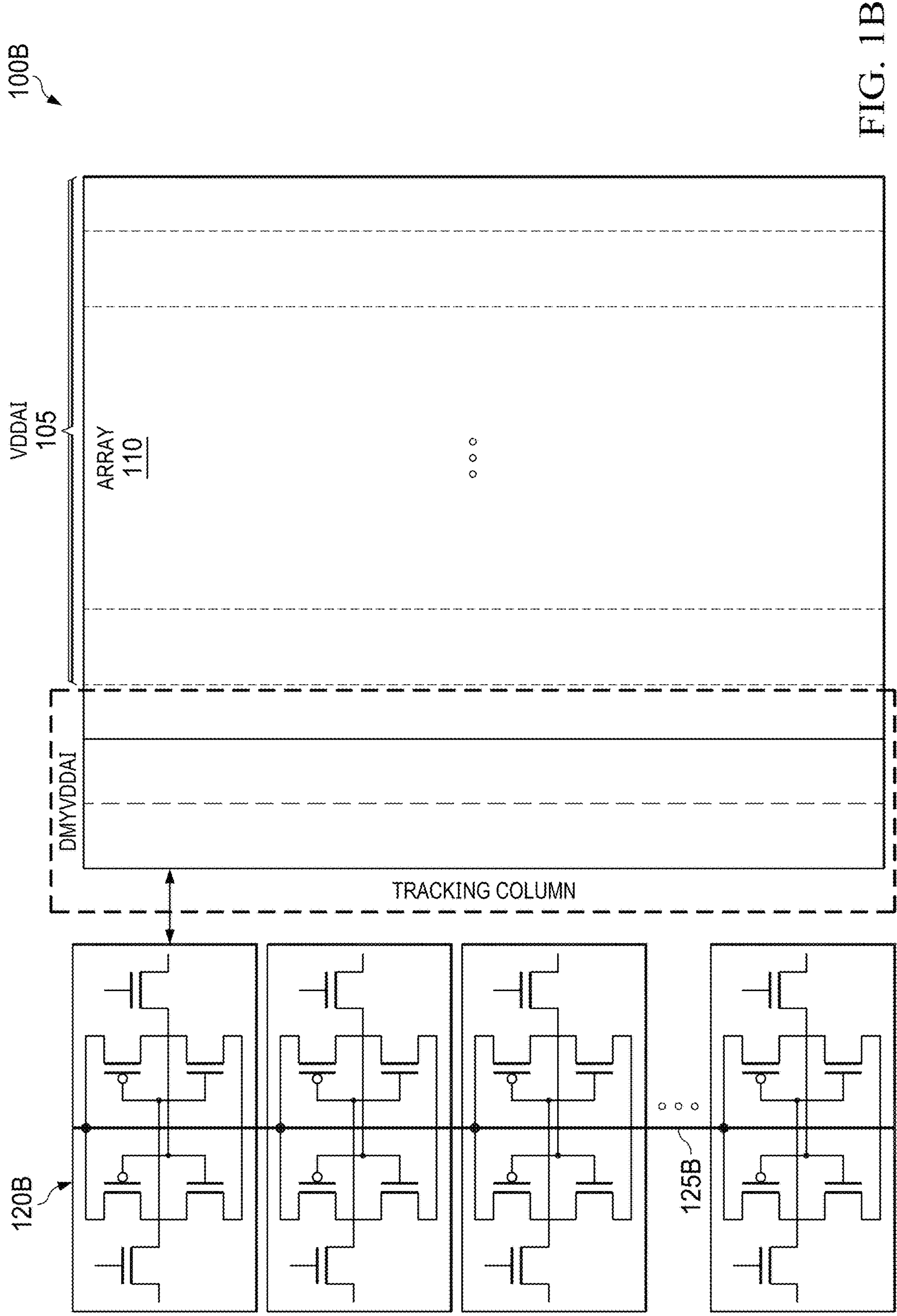
FIG. 1B illustrates a version of the memory circuit of FIG. 1A in which the tracking column is implemented as a column of bitcells, according to some embodiments.

FIG. 1B illustrates an example of a memory circuit 100B that represents a version of the memory circuit 100A of FIG. 1A in which a tracking column 120B for the memory array 110 is implemented as a column of pseudo/dummy bitcells corresponding to the actual bitcells in the memory array 110. The memory array 110 may be, for example, an SRAM array and each bitcell in the memory array 110 may be a single-port or multi-port SRAM cell in any of various configurations, e.g., an SRAM cell with six transistors (6T) in a cross-coupled inverter configuration. Accordingly, the tracking column 120B in this example may be composed of pseudo/dummy SRAM bitcells (e.g., 6T cells) that are identical to the actual bitcells in the SRAM array. In some implementations, the tracking column 120B may include a pseudo/dummy bitcell for each word line and corresponding row of the actual bitcells in the memory array 110. The pseudo/dummy bitcells in the tracking column 120B may be coupled to each other such that a DMYVDDAI 125B of the tracking column 120B as a whole can be measured during a write operation to a bitcell in the memory array 110. For example, the DMYVDDAI 125B may be measured along a corresponding voltage line connecting each of the bitcells in the tracking column 120B. In some embodiments, the DMYVDDAI 125B may be measured based on a RC load of the tracking column 120B during the write operation, where the RC load of the tracking column 120B may be indicative of a discharge rate of the actual VDDAI to the bitcell during the write operation.

Figure 1C:
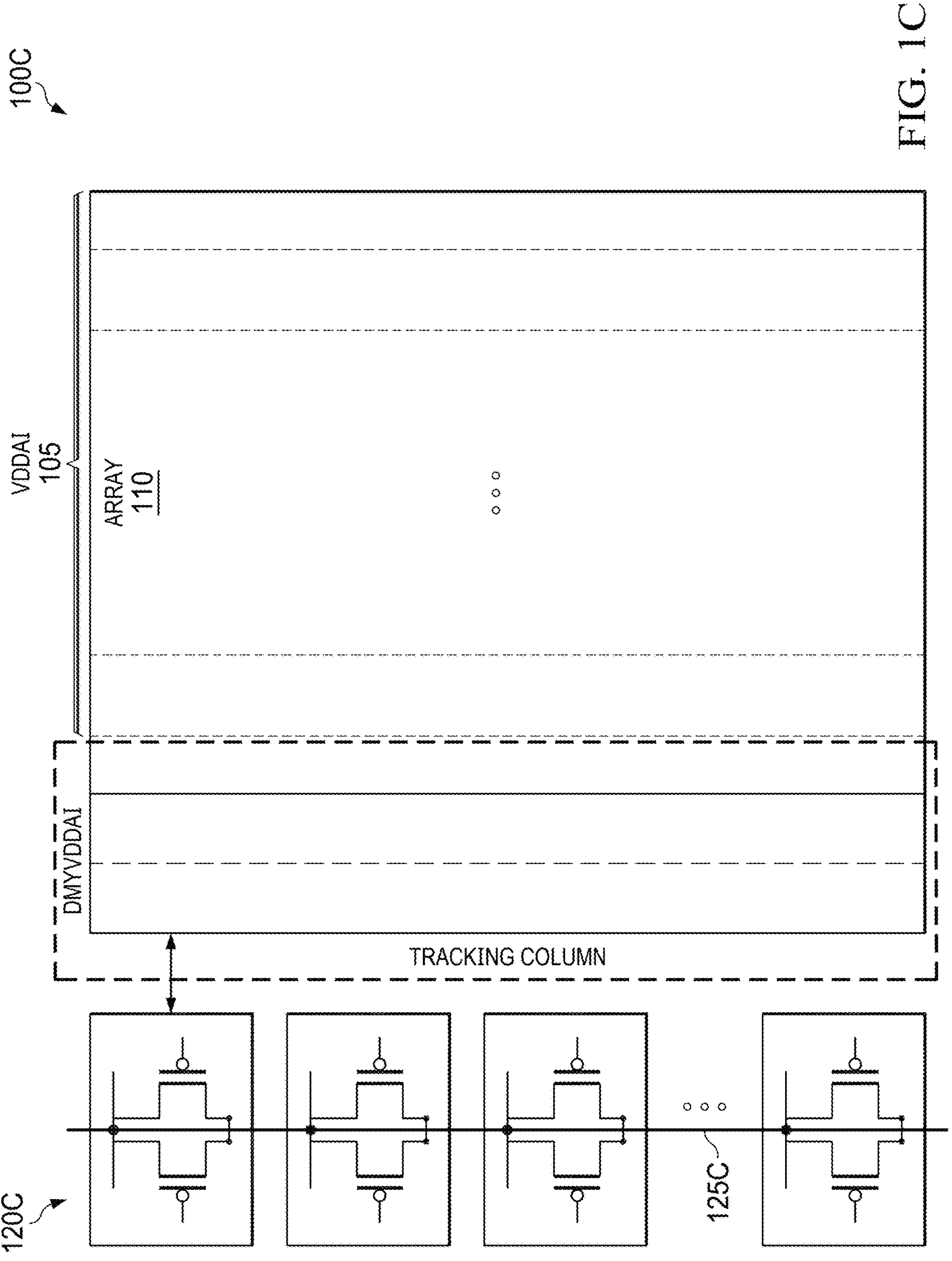
FIG. 1C illustrates another version of the memory circuit of FIG. 1A in which the tracking column is implemented as a column of logic devices, according to some embodiments.

FIG. 1C illustrates an example of a memory circuit 100C that represents a different version of the memory circuit 100A of FIG. 1A, in which a tracking column 120C for the memory array 110 is implemented as a column of logic devices. Each logic device in the tracking column 120C may be implemented using, for example, a pair of p-channel MOSFETs, as described above. Like the pseudo/dummy bitcells in the tracking column 120B of the memory circuit 100B in FIG. 1B described above, the tracking column 120C of the memory circuit 100C in FIG. 1C may include a logic device for each word line and corresponding row of the actual bitcells in the memory array 110. Also, like the pseudo/dummy bitcells in the tracking column 120B in FIG. 1B, the logic devices in the tracking column 120C may be coupled to each other such that a DMYVDDAI 125C of the tracking column 120C can be measured during a write operation to a bitcell in the memory array 110. The DMYVDDAI 125C may be measured, for example, along a corresponding voltage line connecting each of the logic devices in the tracking column 120C.

Like the DMYVDDAI 125B in FIG. 1B described above, the DMYVDDAI 125C in this example may be measured based on a RC load of the tracking column 120C during the write operation, where the RC load of the tracking column 120C may be indicative of a discharge rate of the actual VDDAI to the bitcell during the write operation. In some embodiments, a measured level of the DMYVDDAI 125B in FIG. 1B or the DMYVDDAI 125C in FIG. 1C may be used to generate a write assist pulse that can be used to control the collapse level of the actual VDDAI provided to the bitcell during the write operation, as will be described in further detail below.

Figure 2:
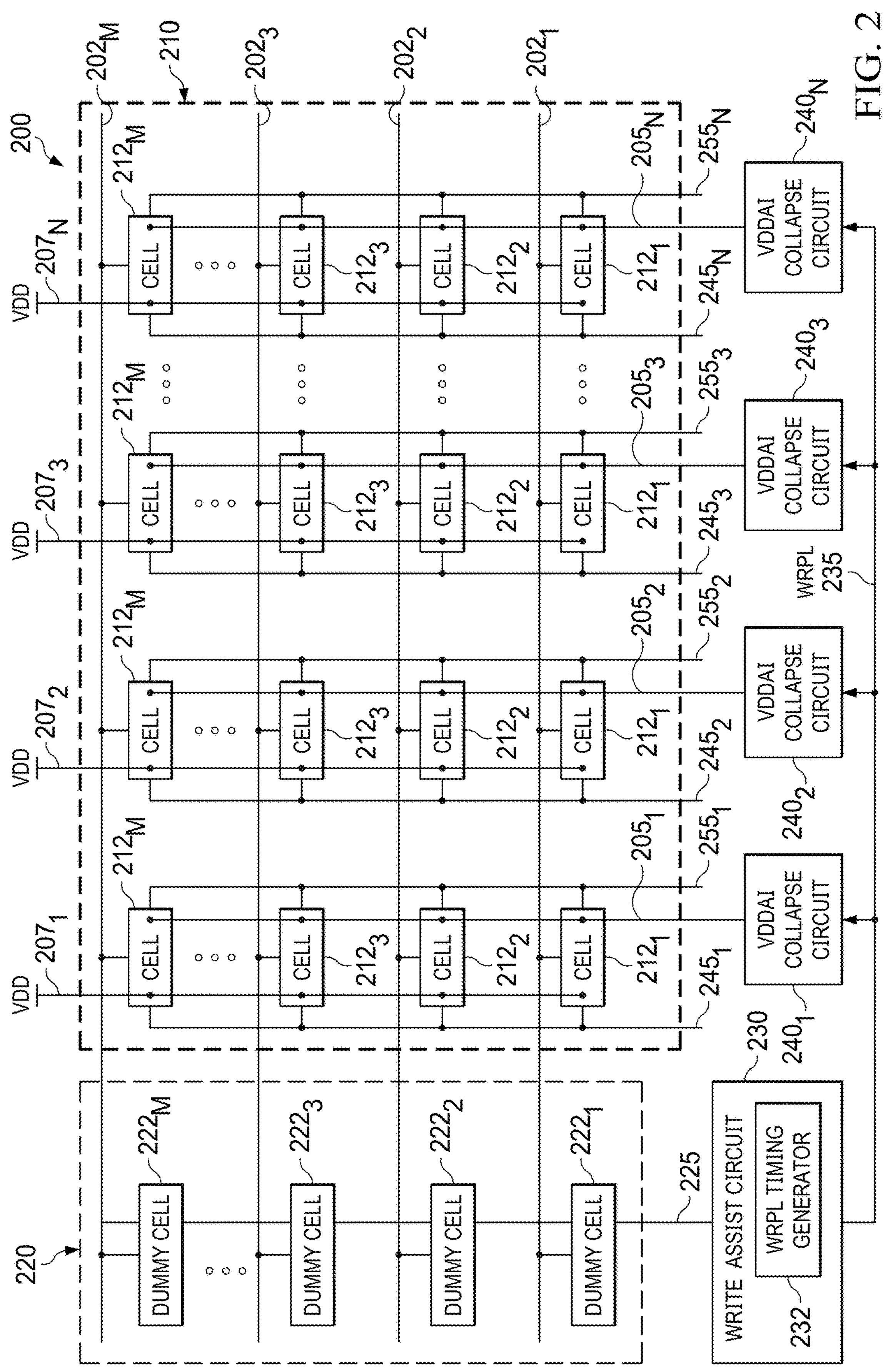
FIG. 2 is a block diagram illustrating an example of a memory circuit system for implementing a transient voltage collapse (TVC) write assist scheme, according to some embodiments.

FIG. 2 is a block diagram illustrating an example of a memory circuit system 200 for implementing a TVC write assist scheme to assist write operations in a memory array (e.g., the memory array 110 of FIGS. 1A-1C, as described above), according to some embodiments. The memory circuit system 200 includes a memory array 210 having M rows of memory cells (or bitcells) 2121, 2122, 2123, . . . , 212M (collectively or individually referred to as cell(s) 212) arranged across N columns, where each of M and N may be any positive integer value. The rows of cells 212 in the memory array 210 are connected to corresponding word lines 2021, 2022, 2023, . . . , 202M (collectively or individually referred to as word line(s) 202). The memory circuit system 200 also includes a bitcell power tracking column 220 having M rows of pseudo or dummy cells 2221, 2222, 2223, . . . , 222M (collectively or individually referred to as dummy cell(s) 222). The tracking column 220 includes a dummy cell 222 for each row of cells 212 and corresponding word line 202 in the memory array 210.

In some embodiments, the dummy cells 222 in the tracking column 220 may mimic the circuit characteristics and processing variations of the memory cells 212. For example, the memory array 210 may be an SRAM array, and the dummy cells 222 may be SRAM bitcells that were manufactured together with the memory cells 212 of the SRAM array, e.g., by the same foundry as the SRAM array using the same manufacturing process under the same environmental conditions, as described above. Alternatively, the dummy cells 222 in the tracking column 220 may be implemented using logic devices (e.g., similar to the logic devices in the tracking column 120C of FIG. 1C, as described above).

The tracking column 220 may be coupled to a write assist circuit 230 via a voltage line corresponding to a pseudo (or "dummy") VDDAI (or DMYVDDAI) 225 of the tracking column 220. The write assist circuit 230 generates a write assist pulse (WRPL) 235 provided to at least one transient voltage (or VDDAI) collapse circuit of the memory circuit system 200. In some implementations, the memory circuit system 200 may include a plurality of VDDAI collapse circuits $\mathbf{240}_1$, $\mathbf{240}_2$, $\mathbf{240}_3$, . . . , $\mathbf{240}_N$ (collectively or individually referred to as VDDAI collapse circuit(s) 240), which provide voltage (VDDAI) to the cells 212 in the N columns of the memory array 210 via corresponding VDDAI supply lines $\mathbf{205}_1$, $\mathbf{205}_2$, $\mathbf{205}_3$, . . . , $\mathbf{205}_N$ (collectively or individually referred to as VDDAI supply line(s) 205). Accordingly, each VDDAI collapse circuit 240 may be configured to provide a level of VDDAI to each of the cells 212 in a corresponding column of the memory array 210 via a corresponding voltage line 205. In other implementations, however, the same VDDAI collapse circuit 240 may be shared by multiple columns of cells 212. For example, the columns of the memory array 210 may be divided into different subsets of columns, and each subset may include two or more columns of cells 212 that are supplied voltage by the same VDDAI collapse circuit 240 via corresponding voltage lines 205. The VDDAI collapse circuit 240 in this example may also include separate control paths that the write assist circuit 230 may use for controlling a collapse level of the VDDAI provided to each of the columns in the subset, as will be described in further detail below.

In addition to the VDDAI supply lines 205, the cells 212 in the N columns of the memory array 210 may also be connected to a core supply voltage (VDD) via corresponding VDD supply lines $\mathbf{207}_1$, $\mathbf{207}_2$, $\mathbf{207}_3$, . . . , $\mathbf{207}_N$ (collectively or individually referred to as VDD supply line(s) 207). The level of VDD supplied to each cell 212 may be higher than the level of VDDAI supplied to that cell. Each cell 212 in the N columns may also be connected to corresponding bit lines $\mathbf{245}_1$, $\mathbf{245}_2$, $\mathbf{245}_3$, . . . , $\mathbf{245}_N$ (collectively or individually referred to as bit line(s) 245) along with bit lines $\mathbf{255}_1$, $\mathbf{255}_2$, $\mathbf{255}_3$, . . . , $\mathbf{255}_N$ (collectively or individually referred to as bit line(s) 255). The bit lines 245 and 255 may be complementary bit lines that provide data to be written to a particular cell 212 in the memory array 210. For example, the data provided at the bit line 255 connected to a cell 212 may be a complement of the data provided at the bit line 245 connected to that cell. Although not shown in FIG. 2, the memory circuit system 200 may include any number of additional circuits, devices, lines, etc. to provide the TVC write assist functionality described herein, as desired for a particular implementation.

To enable a write operation to a cell 212 at the intersection of a row and column in the memory array 210, a voltage on a corresponding word line 202 may be pulled up to a positive array supply voltage (VDDA). The VDDA may also serve as a power source for a corresponding VDDAI collapse circuit 240 to generate the VDDAI provided to the cell 212 via a corresponding VDDAI supply line 205. During the write operation, the write assist circuit 230 may generate and provide the WRPL 235 to the VDDAI collapse circuit 240 to reduce or collapse the VDDAI provided to the cell 212, which assists the flipping of the state or internal storage value of the cell 212 (e.g., from 0 to 1 or from 1 to 0). In some embodiments, the write assist circuit 230 may include a WRPL timing generator 232 for synchronizing the WRPL 235 with a target VDDAI collapse level to control the timing and extent of the VDDAI collapse and minimize any unwanted VDDAI collapse levels during the write operation, particularly at higher VDD values. The target VDDAI collapse level may be, for example, a predetermined collapse level of the VDDAI to the cell 212.

As will be described in further detail below, the WRPL timing generator 232 may track a level of the VDDAI provided to the cell 212 (and VDDAI collapse level) during the write operation based on the DMYVDDAI 225 of the bitcell power tracking column 220. Based on the tracking, the WRPL timing generator 232 may control the timing or duration of the WRPL 235 provided to the VDDAI collapse circuit 240 to stop the VDDAI collapse during the write operation and thereby reduce any unwanted VDDAI collapse levels (e.g., any VDDAI collapse levels extending beyond the target collapse level), which cause significant (or unacceptable) power consumption and recovery times during write operations to the cell 212.

FIG. 3A is a diagram illustrating an example of a bitcell 300A, which may be used to implement any of the cells 212 in the memory array 210 of the memory circuit system 200 of FIG. 2, according to some embodiments. The bitcell 100A may be a 6T SRAM cell including 6 transistors (e.g., MOSFETs): two p-channel transistors mp0 and mp1; and four n-channel transistors mn0, mn1, mx0, and mx1. The p-channel transistors mp0 and mp1 are cross-coupled with n-channel transistors mn0 and mn1 to form a memory bit 301. The sources of the p-channel transistors in this cross-coupled configuration receive a positive internal array supply voltage (VDDAI) 305A from VDDAI collapse circuitry (e.g., a VDDAI collapse circuit 240 of FIG. 2, as described above) via internal array supply lines (e.g., VDDAI supply lines 205 of FIG. 2, as described above). Although not shown in FIG. 3A, it should be appreciated that the bitcell 300A may also be connected to a core supply voltage (VDD) via a VDD supply line similar to the VDD supply line 207 connected to each cell 212 in the memory array 210 of FIG. 2, as described above. The sources of transistors mn0 and mn1 may be coupled to a ground (VSS) voltage supply. The internal storage nodes 304A ("n0") and 306A ("n1") of the bitcell 300A are coupled through n-channel transistors mx0 and mx1 to a bit line true (BT) 345 and a bit line bar (BB) 355 (e.g., the corresponding bit lines 245 and 255 for a cell 212 in the memory array 210 of FIG. 2), respectively. The gates of n-channel transistors mx0 and mx1 are coupled to a word line 302A (e.g., the corresponding word line 202 for a cell 212 in the memory array 210 of FIG. 2).

Figure 3B:
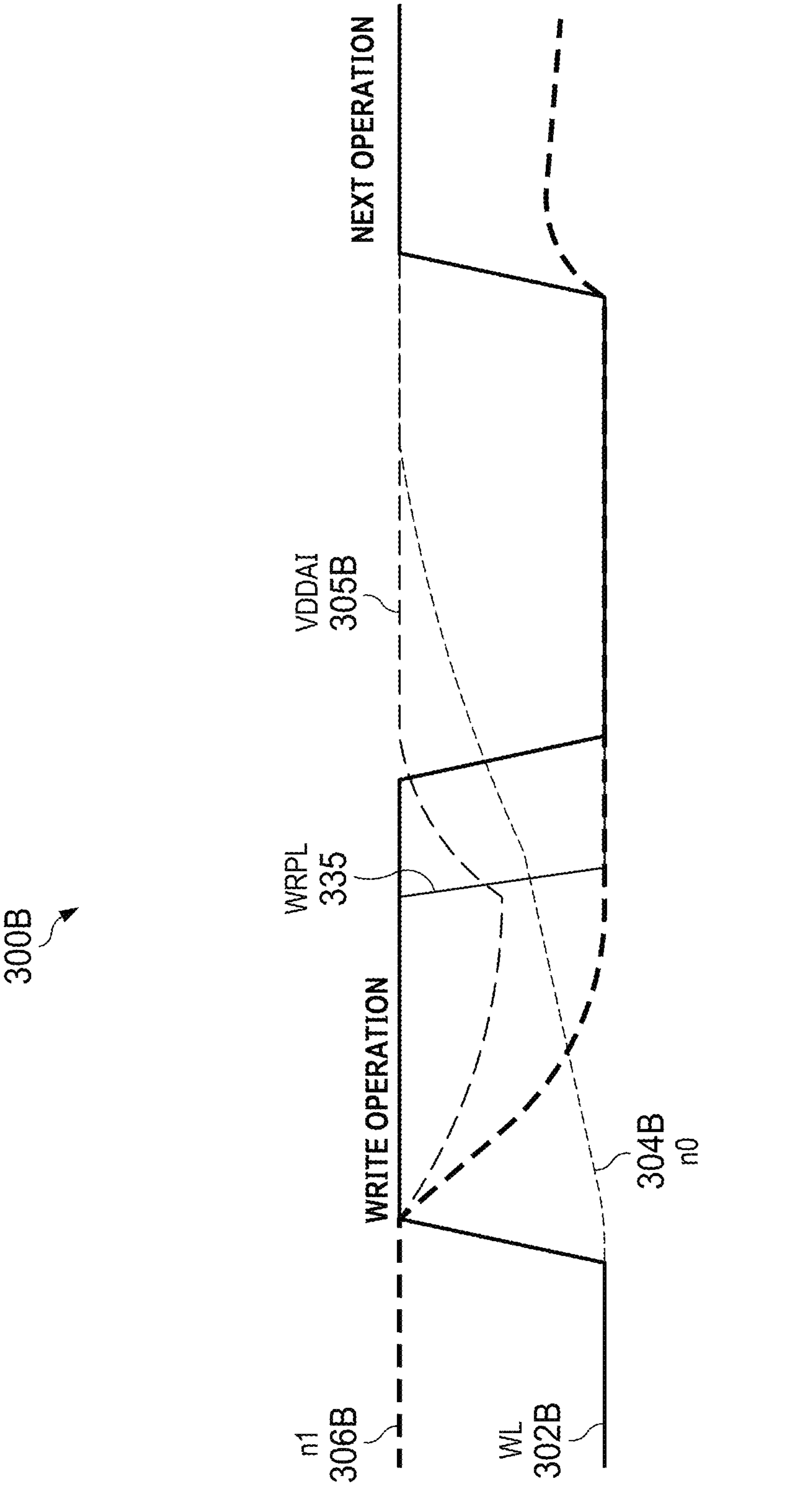
FIG. 3B is a timing diagram illustrating example waveforms for a write operation to the bitcell of FIG. 3A, according to some embodiments.

FIG. 3B is a timing diagram 300B illustrating example waveforms for a write operation to the bitcell 300A of FIG. 3A, according to some embodiments. The timing diagram 300B includes a waveform 302B representing a voltage on the word line (WL) 302A of the bitcell 300A, waveforms 304B and 306B representing voltages on the internal storage nodes 304A (n0) and 306A (n1), respectively, of the bitcell 300A, and a waveform 305B representing the VDDAI 305A provided to the bitcell 300A via corresponding internal array supply lines. Additionally, the timing diagram 300B includes a waveform 335 representing a write assist pulse (WRPL) generated by a write assist circuit (e.g., the WRPL 235 generated by the write assist circuit 230 of FIG. 2, as described above). For ease of discussion, the write operation in this example will be described with reference to the voltages or signals represented by the corresponding waveforms in the timing diagram 300B.

To initiate the write operation, the WL voltage 302B is activated high (e.g., driven to the array supply voltage VDDA). Initially, the voltages 304B and 306B on the internal storage nodes n0 and n1 are low and high, respectively. Prior to the write operation, the VDDAI 305B supplied to the bitcell 300A may be pulled up to the full VDDA. At the start of the write operation, the voltage 304B on the internal storage node n0 is driven high, and the voltage 306B on the internal storage node n1 is driven low. Furthermore, the WRPL 335 is activated to assist the write operation by collapsing the VDDAI 305B to a level below the VDDA, e.g., by discharging the corresponding VDDAI supply lines. When the WRPL 335 is deactivated, the VDDAI 305B stops collapsing and returns to the VDDA, e.g., by charging or recharging the corresponding VDDAI supply lines. The collapse level of the VDDAI 305B during the write operation may be dependent on a width of the WRPL 335. For example, increasing the width of the WRPL 335 (e.g., by extending the duration of the WRPL 335) also increases the collapse level of the VDDAI 305B. Accordingly, a wider (or longer) WRPL 335 may equate to a deeper collapse of the VDDAI 305B. However, the charging and discharging of capacitive loads on the VDDAI supply lines required for deeper or higher VDDAI collapse levels may consume a significant amount of power and extend the recovery time needed to restore the VDDAI to the appropriate VDDA level before the next operation is initiated. As will be described in further detail below, the TVC write assist scheme may be implemented in various ways to control the VDDAI collapse level during the write operation.

Figure 4:
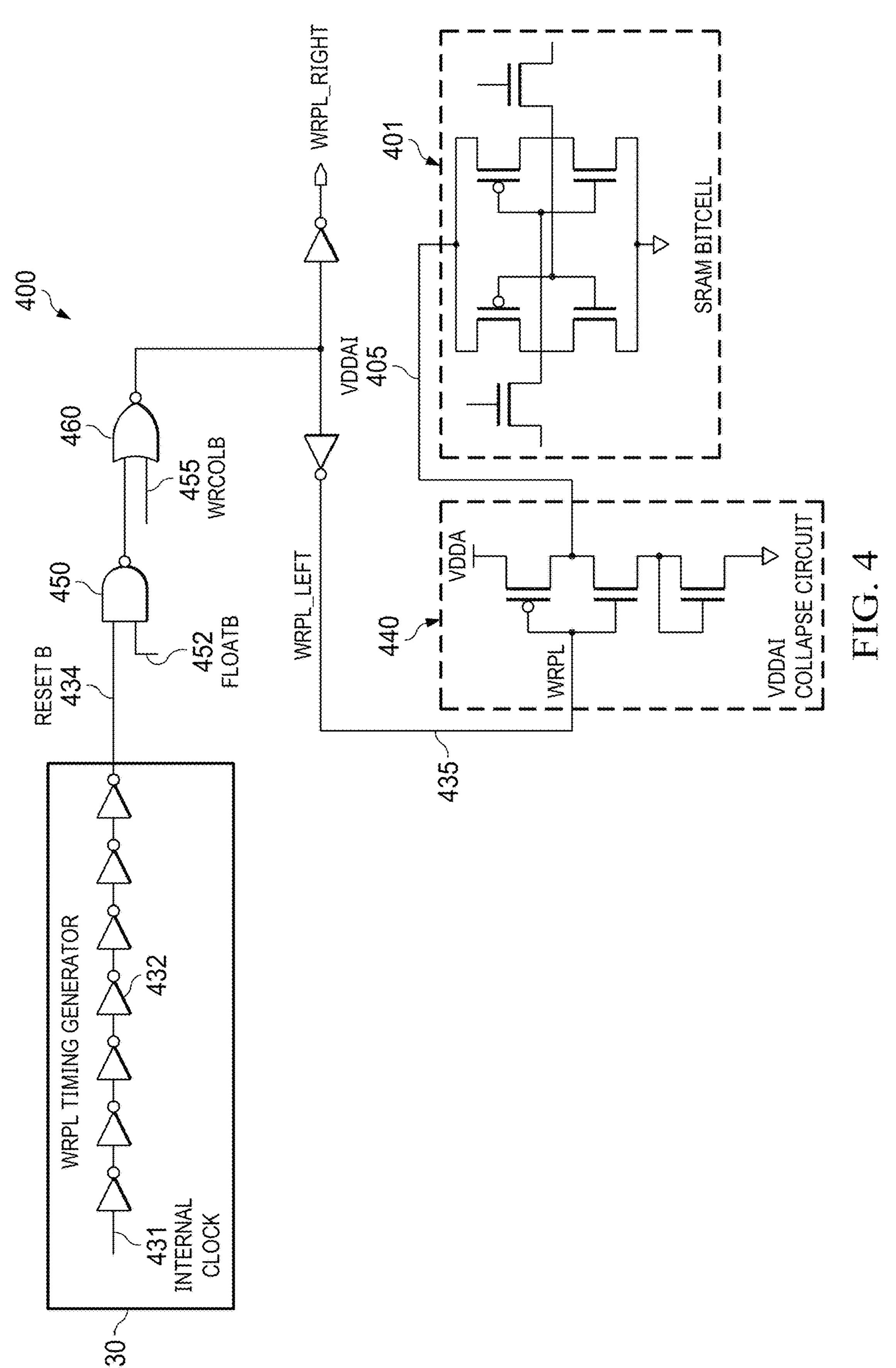
FIG. 4 is a block diagram illustrating an example of a write assist circuit for implementing a TVC write assist scheme with an inverter chain delay, according to some embodiments.

FIG. 4 is a block diagram illustrating an example of a write assist circuit 400 for implementing a TVC write assist scheme with an inverter chain delay to control the VDDAI collapse level during a write operation, according to some embodiments. The write assist circuit 400 may be used to implement, for example, the write assist circuit 230 in the memory circuit system 200 of FIG. 2, as described above. The write assist circuit 400 may be used to assist a write operation to a SRAM bitcell 401 (e.g., a cell 212 in the memory array 210 of the memory circuit system 200 of FIG. 2) by controlling a collapse level of a VDDAI 405 provided to the SRAM bitcell 401 during the write operation. The VDDAI 405 may be provided to the SRAM bitcell 401 by a VDDAI collapse circuit 440 (e.g., a VDDAI collapse circuit 240 in the memory circuit system 200 of FIG. 2). The VDDAI 405 provided by the VDDAI collapse circuit 440 to the bitcell 401 may be temporarily reduced or collapsed based on a WRPL 435 generated by the write assist circuit 400. While the SRAM bitcell 401 and the VDDAI collapse circuit 440 are shown in FIG. 4, it should be appreciated that the SRAM bitcell 401 and the VDDAI collapse circuit 440 are separate from the write assist circuit 400.

The write assist circuit 400 includes a WRPL timing generator 430 having an internal clock 431 and an inverter chain 432. During the write operation, the internal clock 431 may transition between low and high states. The inverter chain 432 may synchronize the generation (including activation and deactivation) of the WRPL 435 with the internal clock 431 to control the collapse level of the VDDAI 405. For example, the WRPL timing generator 430 may use the inverter chain 432 to generate a reset bar (RESETB) signal 434 that triggers deactivation of the WRPL 435 and terminates collapse of the VDDAI 405 after a delay introduced by the inverter chain 432 has elapsed. The length of the delay may be based on the number of inverters used to implement the inverter chain 432. Thus, while seven inverters are shown in the inverter chain 432, any number of inverters may be used as desired for a particular implementation. For example, additional inverters may be added to the inverter chain 432 to increase the delay to ensure there is sufficient time for the VDDAI collapse to reach a minimum collapse target required for the TVC write assist to be effective. The RESETB signal 434 may be provided as a first input to a first logic gate (e.g., a NAND gate) 450, the output of which is provided as an input to a second logic gate (e.g., a NOR gate) 460. The second input to the NAND gate 450 may be a FLOATB signal 452, which is a self-timing control signal to determine the start of the WRPL 435. The output of the NOR gate 460 may be used to control the WRPL 435 provided to the VDDAI collapse circuit 440.

In some implementations, the WRPL 435 may be one of a plurality of WRPL signals generated by the write assist circuit 430 for different control paths of the VDDAI collapse circuit 440 corresponding to different columns of the memory array in a subset of two or more columns to which the VDDAI collapse circuit 440 supplies voltage, as described above. For example, a second input of the NOR gate 460 may be a write column select bar (WRCOLB) signal 455 used to select both left and right control paths of the VDDAI collapse circuit 440 for driving left and right (or first and second) columns of the memory array in the subset of columns via corresponding WRPL_Left and WRPL_Right signals, which may be equivalent to the WRPL 435. For purposes of this example, it is assumed that the VDDAI collapse circuit 440 has only one control path (e.g., corresponding to WRPL_Left) and the WRPL_Right signal is ignored.

Figure 5A:
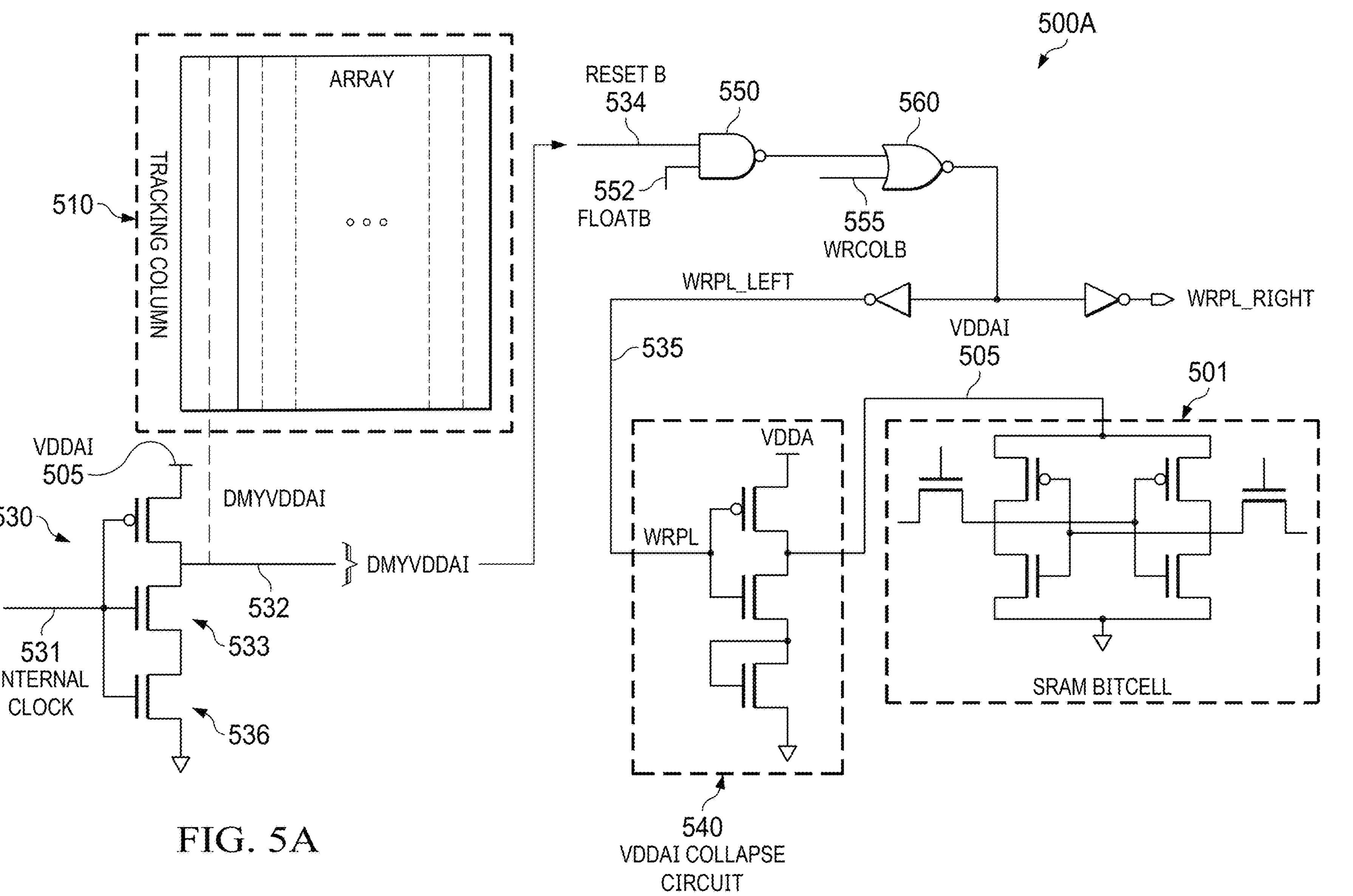
FIG. 5A is a block diagram illustrating another example of a write assist circuit for implementing a TVC write assist scheme with bitcell VDDAI tracking, according to some embodiments.

FIG. 5A is a block diagram illustrating an example of a write assist circuit 500A for implementing a write assist scheme with bitcell VDDAI tracking to control the VDDAI collapse level during a write operation, according to some embodiments. The write assist circuit 500A may be used to implement, for example, the write assist circuit 230 in the memory circuit system 200 of FIG. 2, as described above. The write assist circuit 500A includes a WRPL timing generator 530 that tracks a VDDAI 505 supplied by a VDDAI collapse circuit 540 to a SRAM bitcell 501. The WRPL timing generator 530 may include a VDDAI tracking portion that measures a pseudo or dummy VDDAI (DMYVDDAI) 532 of a bitcell power tracking column coupled to or integrated with a memory array 510 (e.g., the memory array 110 of FIGS. 1A-1C or the memory array 210 of FIG. 2, as described above). While the SRAM bitcell 501 is shown separately from the memory array 510 in FIG. 5A, it should be appreciated that the SRAM bitcell 501 in this example corresponds to a bitcell within the memory array 510. Also, while the SRAM bitcell 501, the memory array 510, and the VDDAI collapse circuit 540 are shown in FIG. 5A, it should be appreciated that the SRAM bitcell 501, the memory array 510, and the VDDAI collapse circuit 540 are separate from the write assist circuit 500A.

In some embodiments, the WRPL timing generator 530 may synchronize the generation of a WRPL 535 provided to the VDDAI collapse circuit 540 with an internal clock 531 to control the collapse level of the VDDAI 505 based on the DMYVDDAI 532 of the tracking column. For example, the WRPL timing generator 530 may generate a reset bar (RESETB) signal 534 that triggers deactivation of the WRPL 535 and terminates collapse of the VDDAI 505 when the DMYVDDAI 532 reaches a target collapse level, as described above. The write assist circuit 500A may also include logic gates 550 and 560 that are similar in design and operation to the logic gates 450 and 460, respectively, of the write assist circuit 400 of FIG. 4, as described above. We can assume in this example that a FLOATB signal 552 to the second input of the NAND gate 550 stays at 1 and that a WRCOLB signal 555 to the second input of the NOR gate 560 stays at 0. Thus, when the RESETB signal 534 is set to 1, the output of the NAND gate 550 is 0, the output of the NOR gate 560 is 1, and the WRPL 535 goes to 0.

Figure 5B:
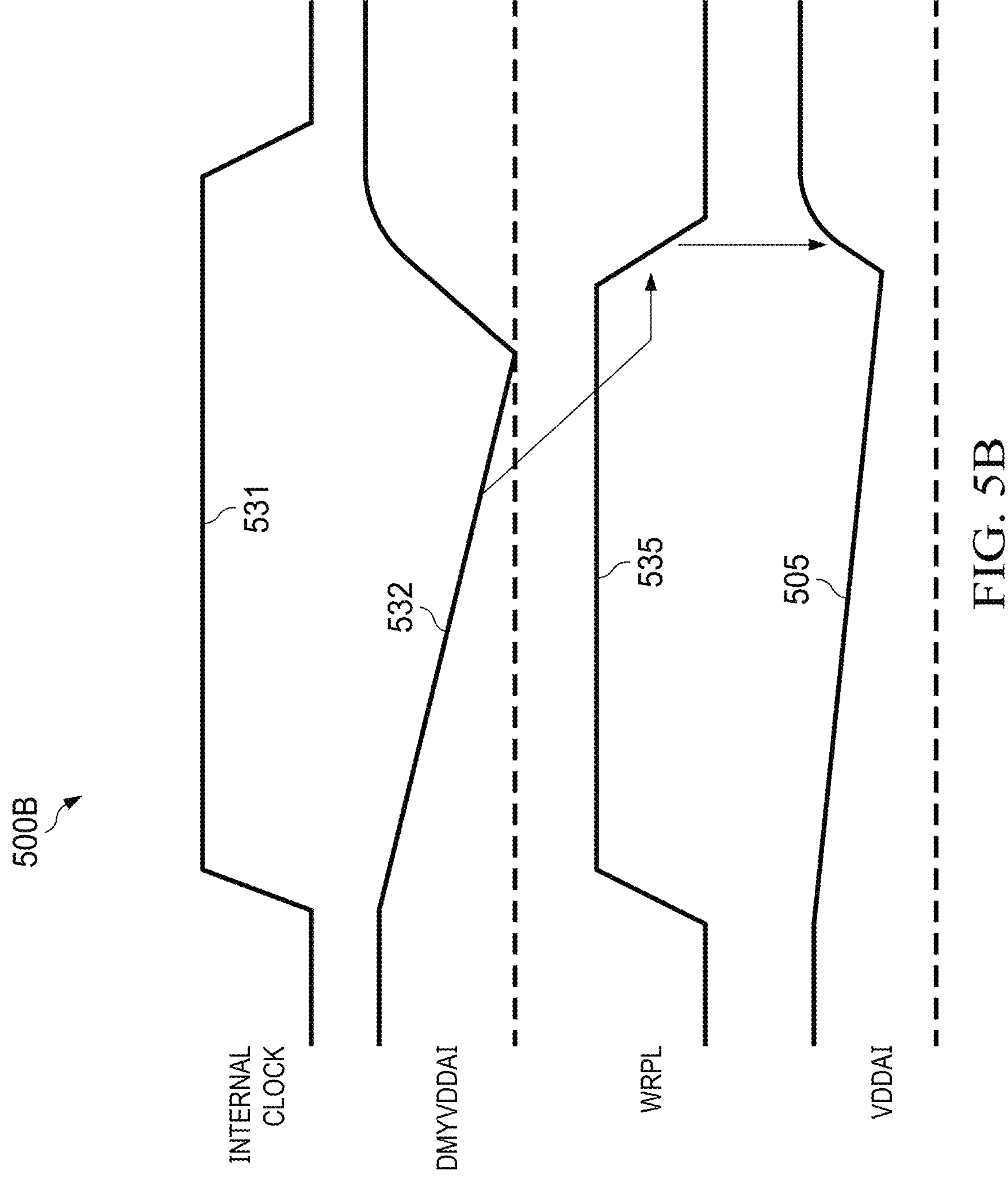
FIG. 5B is a timing diagram illustrating example waveforms for a write operation performed with the VDDAI tracking scheme implemented using the write assist circuit of FIG. 5A, according to some embodiments.

FIG. 5B is a timing diagram 500B illustrating example waveforms for the write operation performed with the VDDAI tracking scheme implemented using the write assist circuit 500A of FIG. 5A, according to some embodiments. The timing diagram 500B includes waveforms corresponding to the internal clock 531, DMYVDDAI 532, and WRPL 535 signals used by the WRPL timing generator 530 of the write assist circuit 500A to control the collapse level of the VDDAI 505 during the write operation. When the internal clock 531 is triggered high, the transistors 533 and 536 of the WRPL timing generator 530 discharge DMYVDDAI 532 to ground and the RESETB signal 534 is generated. As shown by the waveforms in the timing graph 500B, the write assist circuit 500A triggers deactivation of the WRPL 535 to terminate the collapse of the VDDAI 505 when a level of the DMYVDDAI 532 reaches a collapse target, as denoted by the dotted line.

Figure 6:
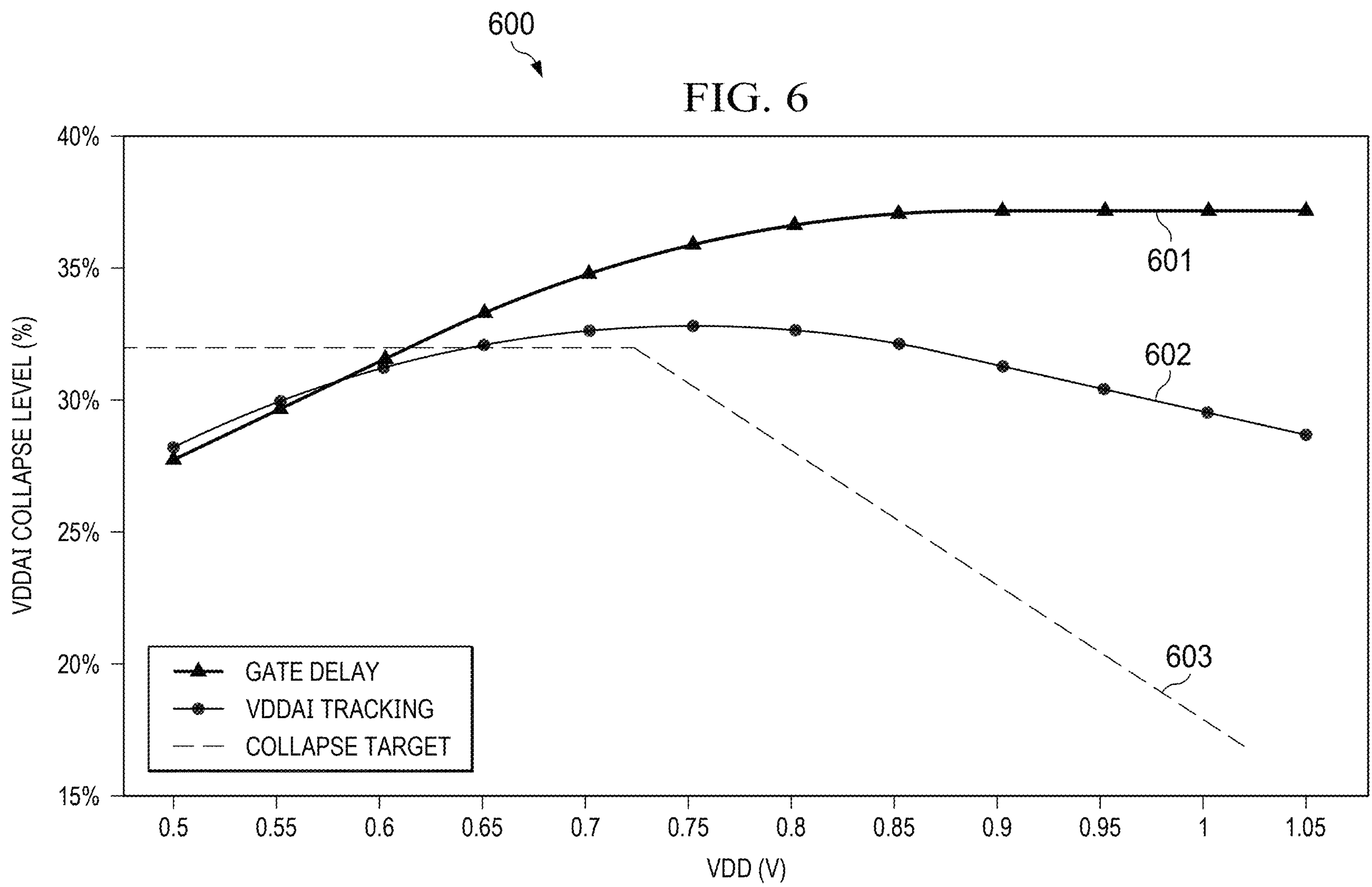
FIG. 6 is a plot graph illustrating an example of VDDAI collapse levels resulting from the inverter chain delay scheme of FIG. 4 versus those resulting from the VDDAI tracking scheme of FIG. 5A across different values of a power supply voltage (VDD), according to some embodiments.

FIG. 6 is a plot graph 600 illustrating an example of VDDAI collapse levels resulting from the inverter chain delay scheme of FIG. 4 versus those resulting from the VDDAI tracking scheme of FIG. 5A across different values of a power supply voltage (VDD), according to some embodiments. The plot graph 600 includes a plot 601 showing the VDDAI collapse levels produced by the inverter chain delay scheme relative to a collapse target 603 at different VDD values. The plot graph 600 also includes a plot 602 showing the VDDAI collapse levels produced by the VDDAI tracking scheme relative to the collapse target 603 across the same VDD values. For purposes of this example, it is assumed that the collapse target 603 does not exceed 35% of the VDD value. A comparison of the plots 601 and 602, however, shows that only the VDDAI tracking scheme achieves the collapse target 603 at relatively higher VDD values (e.g., at 0.75 volts or higher). By contrast, the inverter chain delay scheme produces unwanted collapse levels that exceed the collapse target 603 at these high voltages. As described above, such unwanted collapse levels may unnecessarily increase power consumption and extend recovery times during bitcell write operations.

Figure 7:
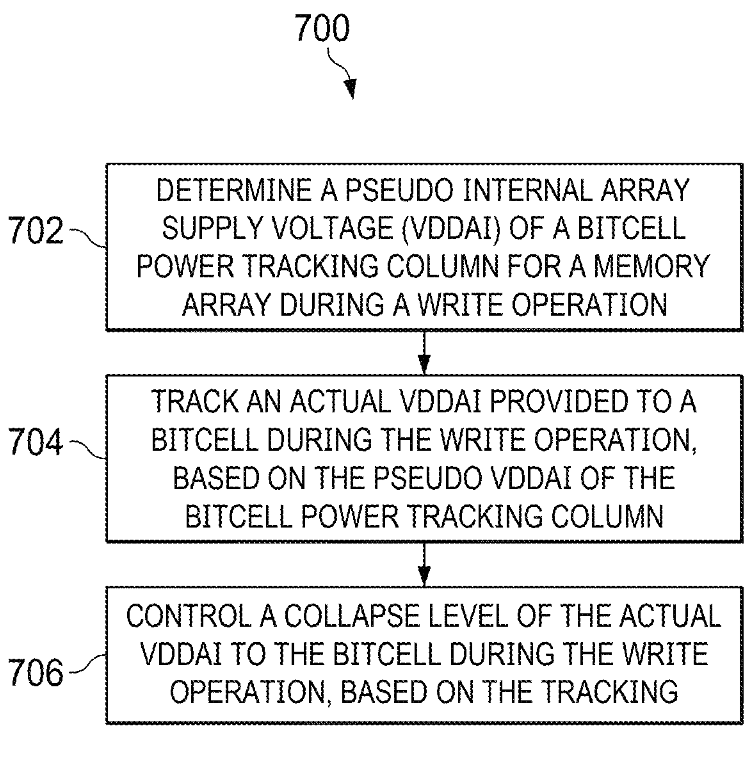
FIG. 7 is a flowchart of a process for a TVC write assist scheme with VDDAI tracking during write operations, according to some embodiments.

FIG. 7 is a flowchart of a process 700 for a write assist scheme with VDDAI tracking during write operations, according to some embodiments. For discussion purposes, the process 700 will be described using the memory circuit system 200 of FIG. 2, as described above, but the process 700 is not intended to be limited thereto. For example, the process 700 may be implemented using the memory circuit system 200 of FIG. 2.

At 702, a pseudo internal array supply voltage (pseudo VDDAI or DMYVDDAI) of a bitcell power tracking column (e.g., the tracking column 220 of FIG. 2) for a memory array (e.g., the memory array 210 of FIG. 2) is determined during a write operation to a bitcell in the memory array. The pseudo VDDAI may be measured by a write assist circuit (e.g., the write assist circuit 230 of FIG. 2) coupled to the memory array. As described above, the pseudo VDDAI may correspond to an actual VDDAI provided to the bitcell during the write operation. In some embodiments, the actual VDDAI is provided to the bitcell by a transient voltage collapse circuit (e.g., a corresponding VDDAI collapse circuit 240 of FIG. 2) coupled to the memory array.

At 704, the actual VDDAI to the bitcell (or discharge rate thereof) is tracked or monitored during the write operation, based on the pseudo VDDAI of the bitcell power tracking column measured at block 702. For example, the pseudo VDDAI may be measured or determined at 702 based on a resistive capacitance (RC) load of the bitcell power tracking column. As the RC load may be indicative of a discharge rate of the actual VDDAI (e.g., from the full VDDA level) to the bitcell, it can be used to track or monitor a level of the actual VDDAI over the course of the write operation. As described above, the bitcell power tracking column may be a column of pseudo bitcells corresponding to actual bitcells in the memory array. The bitcell power tracking column may include a pseudo bitcell for each word line and corresponding row of the actual bitcells in the memory array.

At 706, a collapse level of the actual VDDAI to the bitcell is controlled during the write operation, based on the tracking. In some embodiments, the collapse level may be controlled by generating a write assist pulse to assist the write operation, based on the tracking at block 704. The generation of the write assist pulse may include, for example, activating the pulse to initiate a collapse of the actual VDDAI and deactivating the pulse to stop the collapse when the pseudo VDDAI indicates that the collapse level of the actual VDDAI has reached a collapse target during the write operation. The generated pulse may be provided to the transient voltage collapse circuit described above to control the collapse level of the actual VDDAI provided by the transient voltage collapse circuit to the bitcell during the write operation.

An example is a method. A pseudo array supply voltage (VDDAI) of a bitcell power tracking column for a memory array is determined by a write assist circuit coupled to the memory array. An actual VDDAI provided to a bitcell in the memory array during a write operation, based on the pseudo VDDAI of the bitcell power tracking column, is tracked by the write assist circuit. A collapse level of the actual VDDAI to the bitcell is controlled during the write operation, based on the tracking.

Another example is a memory circuit system. The memory circuit system includes a memory array and a write assisted circuit. The memory array has a plurality of bitcells arranged in rows and columns. At least one of the columns is a bitcell power tracking column. The write assist circuit is to perform operations to: determine a pseudo array supply voltage (VDDAI) of the bitcell power tracking column in the memory array; track an actual VDDAI provided to a bitcell in the memory array during a write operation, based on the pseudo VDDAI of the bitcell power tracking column; and control a collapse level of the actual VDDAI to the bitcell during the write operation, based on the tracking.

A further example is a non-transitory computer-readable storage medium. The non-transitory computer-readable storage medium includes stored instructions. The instructions, which when executed by one or more processors, cause the one or more processors to: determine a pseudo array supply voltage (VDDAI) of a bitcell power tracking column for a memory array; track an actual VDDAI provided to a bitcell in the memory array during a write operation, based on the pseudo VDDAI of the bitcell power tracking column; and control a collapse level of the actual VDDAI to the bitcell during the write operation, based on the tracking.

Figure 8:
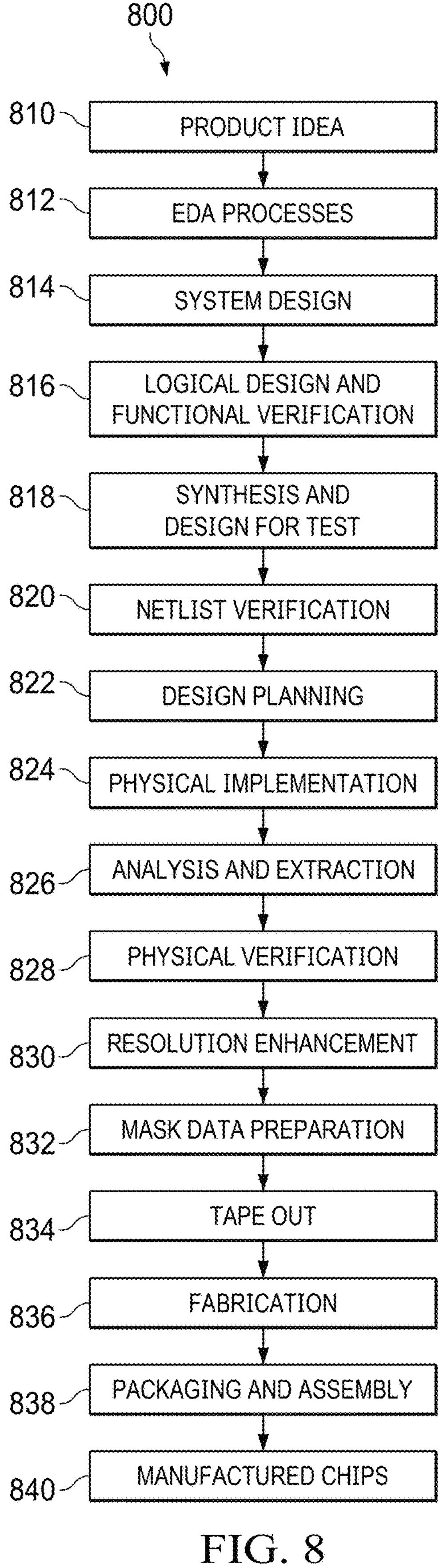
FIG. 8 is a flowchart of various processes used during the design, verification, and manufacture of an integrated circuit in accordance with some embodiments of the present disclosure.

FIG. 8 is a flowchart of various processes 800 used during the design, verification, and manufacture of an integrated circuit (e.g., the memory circuits 100A, 100B, and 100C of FIGS. 1A-1C, the memory circuit system 200 of FIG. 2, and the write assist circuits 400 and 500A of FIGS. 4 and 5A, respectively, as described above) in accordance with some embodiments of the present disclosure. Each of these processes can be structured and enabled as multiple modules or operations. The term 'EDA' signifies the term 'Electronic Design Automation.' These processes start with the creation of a product idea 810 with information supplied by a designer, information which is transformed to create an article of manufacture that uses a set of EDA processes 812.

Specifications for a circuit or electronic structure may range from low-level transistor material layouts to high-level description languages. A high-level of representation may be used to design circuits and systems, using a hardware description language (HDL) such as VHDL, Verilog, System Verilog, SystemC, MyHDL or Open Vera. The HDL description can be transformed to a logic-level register transfer level (RTL) description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process for the integrated circuit may use a sequence of the processes 800 depicted in FIG. 8. The EDA processes 812 in particular may be enabled by one or more EDA products (or EDA systems).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

When the design is finalized, the design is taped out, which is when artwork (e.g., geometric patterns) for the integrated circuit is sent to a fabrication facility to manufacture the mask set, which is then used to manufacture the integrated circuit. During mask data preparation 832, mask (or tape-out) data is created to be used (after lithographic enhancements are applied if appropriate) for production of lithography masks. During tape-out 834, the 'tape-out' data is used to produce lithography masks that are used to produce finished integrated circuits. After tape-out, a semiconductor die is fabricated 836 and packaging and assembly processes 838 are performed to produce the finished integrated circuit 840.

A storage subsystem of a computer system (such as computer system 900 of FIG. 9, as will be described below) may be used to store the programs and data structures that are used by some or all of the EDA products described herein, and products used for development of cells for the library and for physical and logical design that use the library.

Figure 9:
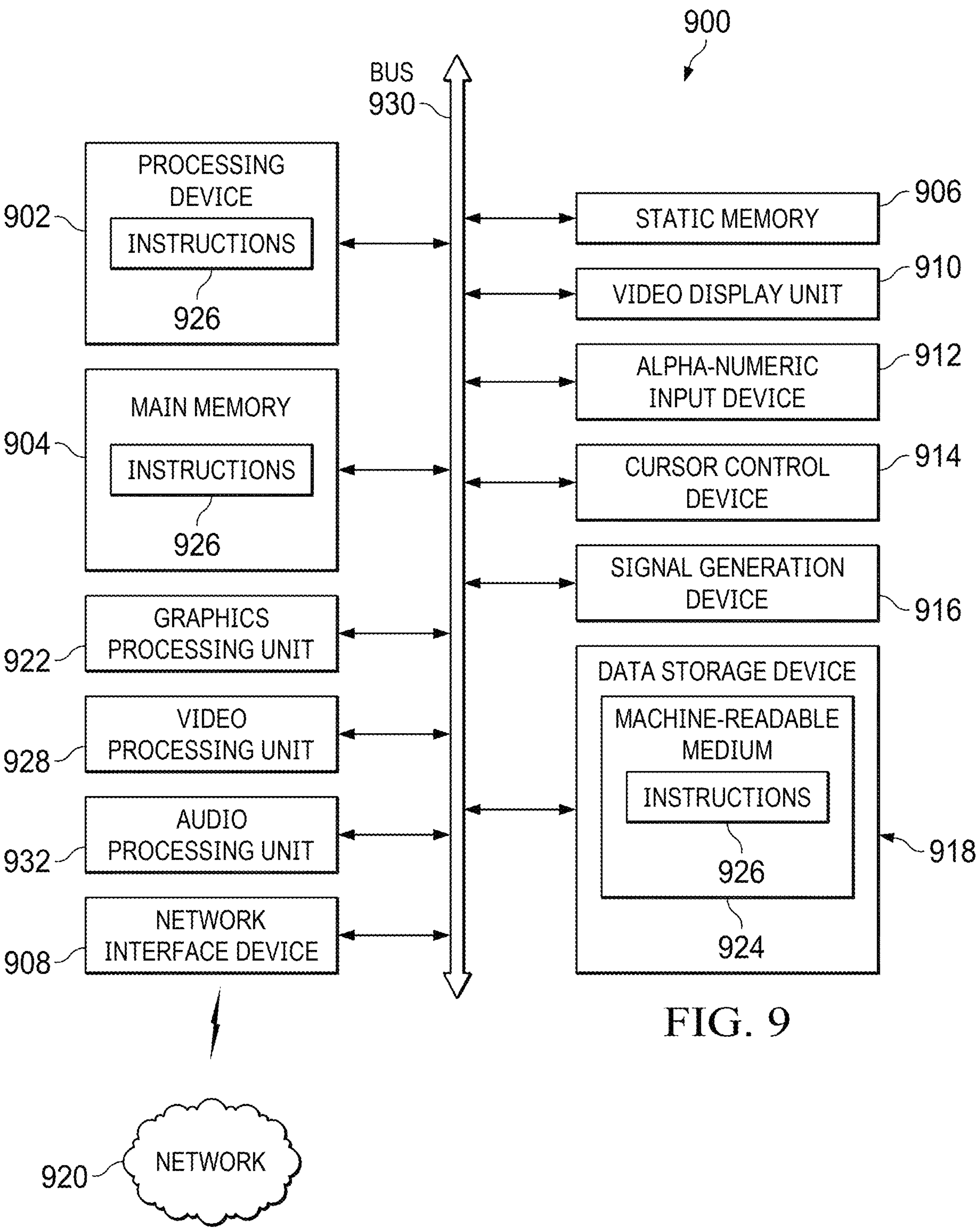
FIG. 9 is a diagram of an example computer system in which embodiments of the present disclosure may operate.

FIG. 9 is a diagram of an example computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable storage medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a non-transitory computer-readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable storage medium having stored thereon instructions, which may be used to program a computer system (or other electronic devices) to perform a process according to the present disclosure. A machine-readable storage medium includes any mechanism for storing information in a form readable by a machine (e.g., a computer). For example, a machine-readable (e.g., a computer-readable) storage medium includes a machine-readable (e.g., a computer-readable) storage medium such as a read only memory (ROM), random access memory (RAM), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:

determining, by a write assist circuit coupled to a memory array, a pseudo array supply voltage (VDDAI) of a bitcell power tracking column for the memory array;

tracking, by the write assist circuit, an actual VDDAI provided to a bitcell in the memory array during a write operation, based on the pseudo VDDAI of the bitcell power tracking column; and controlling a collapse level of the actual VDDAI to the bitcell during the write operation, based on the tracking.

2. The method of claim 1, wherein the actual VDDAI is provided to the bitcell by a transient voltage collapse circuit coupled to the memory array.

3. The method of claim 2, wherein the controlling comprises:

generating a write assist pulse to assist the write operation, based on the tracking; and providing, to the transient voltage collapse circuit, the write assist pulse to control the collapse level of the actual VDDAI provided by the transient voltage collapse circuit to the bitcell during the write operation.

4. The method of claim 1, wherein the pseudo VDDAI is determined based on a resistive capacitance (RC) load of the bitcell power tracking column during the write operation, and wherein the RC load of the bitcell power tracking column is indicative of a discharge rate of the actual VDDAI during the write operation.

5. The method of claim 4, wherein the bitcell power tracking column is a column of pseudo bitcells corresponding to actual bitcells in the memory array, and wherein the column of pseudo bitcells includes a pseudo bitcell for each word line and corresponding row of the actual bitcells in the memory array.

6. The method of claim 5, wherein the memory array is a static random-access memory (SRAM) array, and wherein the pseudo bitcells are SRAM bitcells manufactured together with the actual bitcells in the SRAM array.

7. The method of claim 4, wherein the bitcell power tracking column is a column of logic devices corresponding to actual bitcells in the memory array, and wherein the column of logic devices includes a logic device for each word line and corresponding row of the actual bitcells in the memory array.

8. The method of claim 7, wherein each logic device in the bitcell power tracking column is implemented using a pair of p-channel metal oxide semiconductor field effect transistors.

9. A memory circuit system comprising:

a memory array having a plurality of bitcells arranged in rows and columns, wherein at least one of the columns is a bitcell power tracking column; and a write assist circuit to perform operations to:

determine a pseudo array supply voltage (VDDAI) of the bitcell power tracking column in the memory array;

track an actual VDDAI provided to a bitcell in the memory array during a write operation, based on the pseudo VDDAI of the bitcell power tracking column; and control a collapse level of the actual VDDAI to the bitcell during the write operation, based on the tracking.

10. The memory circuit system of claim 9, further comprising:

a transient voltage collapse circuit coupled to the memory array, wherein the actual VDDAI is provided to the bitcell by the transient voltage collapse circuit.

11. The memory circuit system of claim 10, wherein the operations performed by the write assist circuit further comprise operations to:

generate a write assist pulse to assist the write operation, based on the tracking of the actual VDDAI to the bitcell; and provide, to the transient voltage collapse circuit, the write assist pulse to control the collapse level of the actual VDDAI to the bitcell during the write operation.

12. The memory circuit system of claim 9, wherein the pseudo VDDAI is determined based on a resistive capacitance (RC) load of the bitcell power tracking column during the write operation, and wherein the RC load of the bitcell power tracking column is indicative of a discharge rate of the actual VDDAI during the write operation.

13. The memory circuit system of claim 12, wherein the bitcell power tracking column is a column of pseudo bitcells corresponding to actual bitcells in the memory array, and wherein the column of pseudo bitcells includes a pseudo bitcell for each word line and corresponding row of the actual bitcells in the memory array.

14. The memory circuit system of claim 12, wherein the bitcell power tracking column is a column of logic devices corresponding to actual bitcells in the memory array, and wherein the column of logic devices includes a logic device for each word line and corresponding row of the actual bitcells in the memory array.

15. A non-transitory computer-readable storage medium comprising stored instructions, which when executed by one or more processors, cause the one or more processors to:

determine a pseudo array supply voltage (VDDAI) of a bitcell power tracking column for a memory array;

track an actual VDDAI provided to a bitcell in the memory array during a write operation, based on the pseudo VDDAI of the bitcell power tracking column; and control a collapse level of the actual VDDAI to the bitcell during the write operation, based on the tracking.

16. The non-transitory computer-readable storage medium of claim 15, wherein the actual VDDAI is provided to the bitcell by a transient voltage collapse circuit coupled to the memory array.

17. The non-transitory computer-readable storage medium of claim 16, wherein the operations performed by the one or more processors further comprise operations to:

generate a write assist pulse to assist the write operation, based on the tracking; and provide, to the transient voltage collapse circuit, the write assist pulse to control the collapse level of the actual VDDAI to the bitcell during the write operation.

18. The non-transitory computer-readable storage medium of claim 15, wherein the pseudo VDDAI is determined based on a resistive capacitance (RC) load of the bitcell power tracking column during the write operation, and wherein the RC load of the bitcell power tracking column is indicative of a discharge rate of the actual VDDAI during the write operation.

19. The non-transitory computer-readable storage medium of claim 18, wherein the bitcell power tracking column is a column of pseudo bitcells corresponding to actual bitcells in the memory array, and wherein the column of pseudo bitcells includes a pseudo bitcell for each word line and corresponding row of the actual bitcells in the memory array.

20. The non-transitory computer-readable storage medium of claim 18, wherein the bitcell power tracking column is a column of logic devices corresponding to actual bitcells in the memory array, and wherein the column of logic devices includes a logic device for each word line and corresponding row of the actual bitcells in the memory array.

* * * * *